US010622272B1

(12) United States Patent
Liang et al.

(10) Patent No.: US 10,622,272 B1
(45) Date of Patent: Apr. 14, 2020

(54) SEMICONDUCTOR CHIP STRUCTURE AND SEMICONDUCTOR PACKAGE

(71) Applicant: Advanced Semiconductor Engineering, Inc., Kaohsiung (TW)

(72) Inventors: Chia Lun Liang, Kaohsiung (TW); Shang Ju Lee, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/169,993

(22) Filed: Oct. 24, 2018

(51) Int. Cl.
*H01L 23/02* (2006.01)
*H01L 23/31* (2006.01)
*H01L 23/528* (2006.01)
*H01L 21/78* (2006.01)
*H01L 21/306* (2006.01)
*H01L 21/308* (2006.01)
*H01L 23/58* (2006.01)

(52) U.S. Cl.
CPC ........ *H01L 23/3114* (2013.01); *H01L 21/308* (2013.01); *H01L 21/30612* (2013.01); *H01L 21/78* (2013.01); *H01L 23/3171* (2013.01); *H01L 23/528* (2013.01); *H01L 23/585* (2013.01)

(58) Field of Classification Search
CPC ............... H01L 23/311; H01L 23/3114; H01L 23/3171; H01L 23/528; H01L 23/585
See application file for complete search history.

(56) References Cited

U.S. PATENT DOCUMENTS

| 2011/0316024 A1* | 12/2011 | Hung ................... H01L 33/486 257/98 |
| 2017/0140989 A1 | 5/2017 | Tabuchi et al. |
| 2017/0256638 A1 | 9/2017 | MacElwee et al. |
| 2017/0293065 A1* | 10/2017 | Kim ..................... G02B 6/0021 |
| 2018/0188451 A1* | 7/2018 | Tseng ................. G02B 6/12004 |

OTHER PUBLICATIONS

Tsao, P.H. et al., "Investigation of Production Quality and Reliability Risk of ELK Wafer WLCSP Package", 2017 IEEE 67th Electronic Components and Technology Conference, 5 pgs.

* cited by examiner

*Primary Examiner* — Phuc T Dang
(74) *Attorney, Agent, or Firm* — Foley & Lardner LLP

(57) ABSTRACT

A semiconductor chip structure includes a substrate having a top surface, a bottom surface, and a lateral surface connecting the top surface and the bottom surface. The lateral surface includes a first portion having a first surface roughness and being in proximity to the top surface, and a second portion having a second surface roughness and being in proximity to the bottom surface. The first surface roughness is greater than the second surface roughness. A method for manufacturing the semiconductor chip structure is also provided.

20 Claims, 16 Drawing Sheets

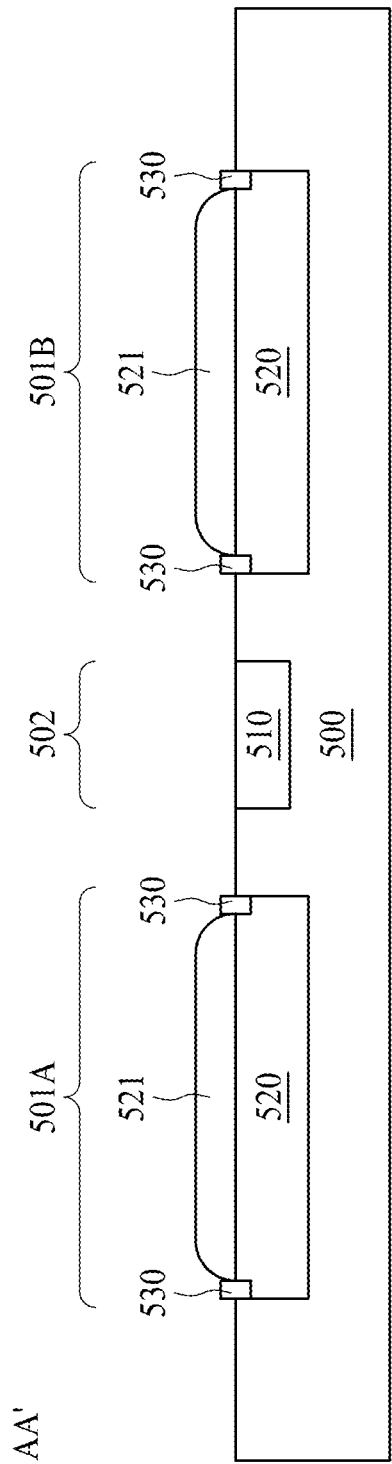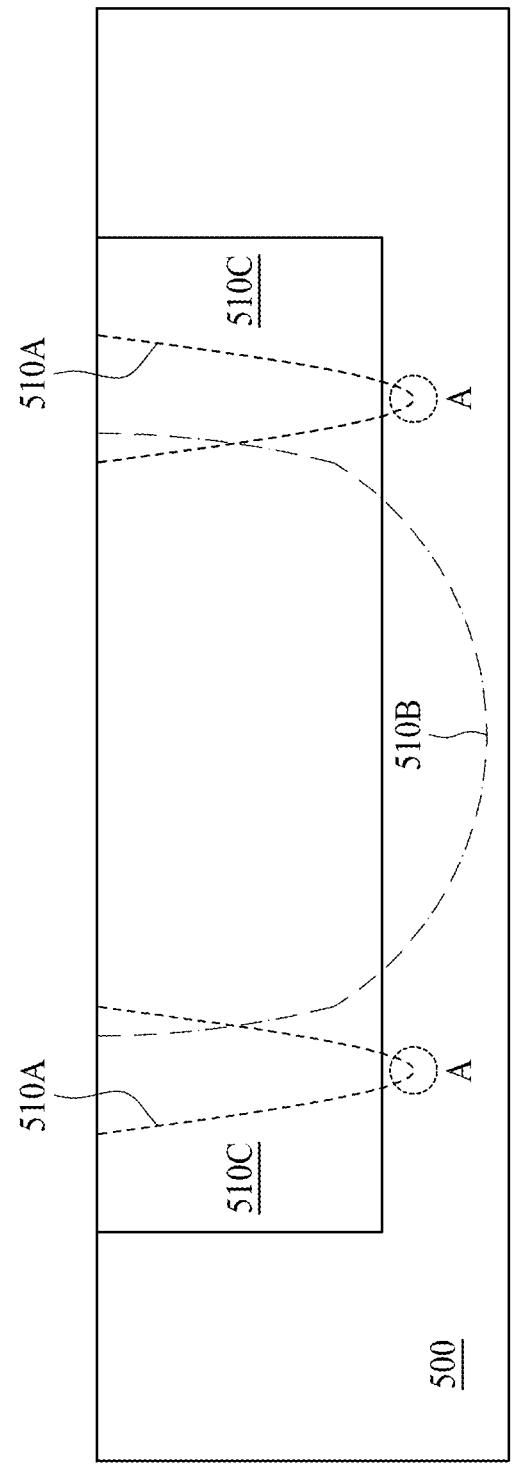

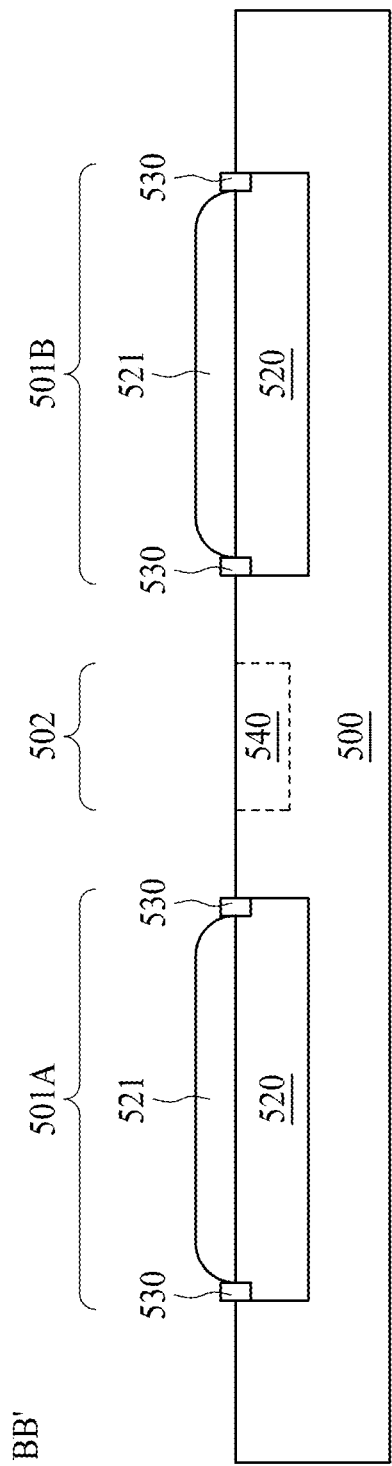
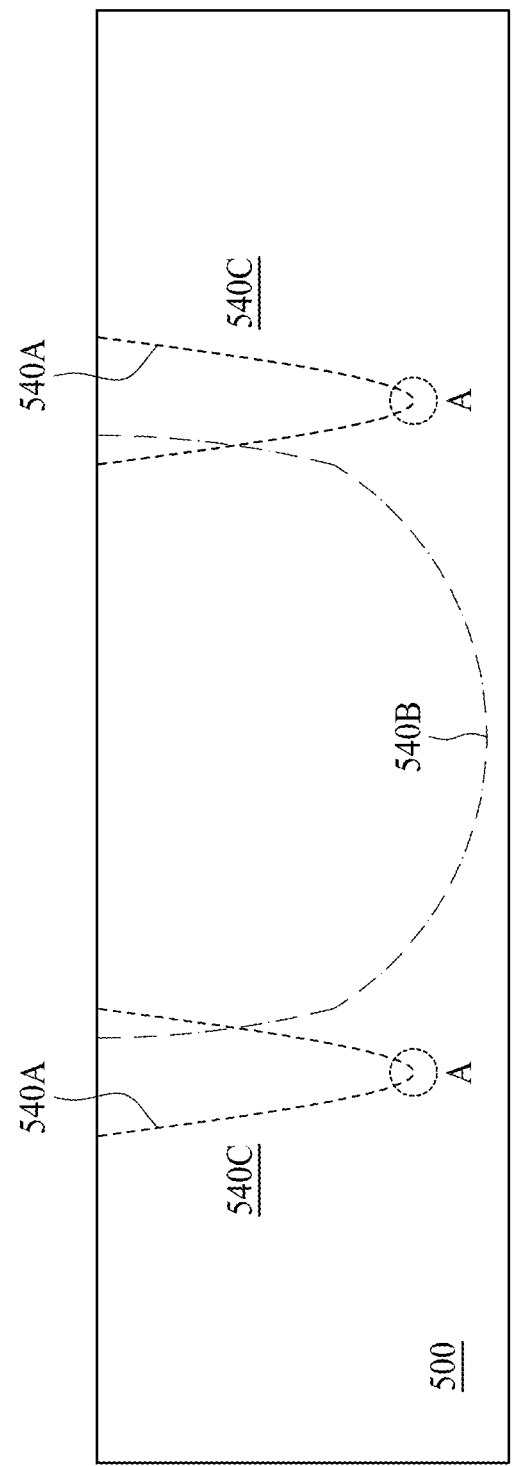
FIG. 9A
FIG. 9B

US 10,622,272 B1

SEMICONDUCTOR CHIP STRUCTURE AND SEMICONDUCTOR PACKAGE

BACKGROUND

Nowadays, many semiconductor devices are formed over a single-crystal silicon wafer. To increase production and lower production cost, the diameter of a silicon wafer has gradually increased. Consequently, more silicon chips can be formed over a single wafer. However, due to constraints of a sawing operation and deformation prevention during pressure and thermal processing, a silicon wafer is thinned down to a certain thickness.

In comparative semiconductor manufacturing process, a silicon wafer is first polished to form a mirror surface. The mirror surface of the silicon wafer then undergoes a series of operations including deposition, photolithographic operation, etching, doping and thermal processing to form devices and interconnections. In order to form a thin and lightweight package such as a thin small outline package (TSOP), the thickness of the silicon wafer is further reduced. Therefore, before the silicon chips are sawn out for packaging, a tape is attached to the active surface of the wafer and the back surface is then ground until a thickness of about 100 to 300 micrometers. After the grinding operation, the tape is removed from the active surface. Another tape is attached to the back surface of the wafer and wafer sawing is carried out from the active surface to form a plurality of individual silicon chips. Since the area-to-thickness ratio increases tremendously after wafer grinding, transportation of the ground wafer and the process of removing the tape from the active surface and the subsequent attachment of the tape on the back surface of the wafer often produce cracks on the wafer.

In comparative processes, wafer sawing is conducted after the thickness of the wafer has been reduced by grinding. Cutting of silicon wafer is usually done by running the sawing blade from a top surface of the wafer along kerfs between silicon chips down towards a back surface of the wafer. Because thickness of the wafer has been reduced by grinding, stress created during the sawing operation often produces cracks on the top surface adjacent to the kerfs. Aside from cracks, chipping also contributes additional damages to the top surface of the silicon chip. In subsequent chip packaging operations such as molding or encapsulation, and assembly operations such as surface mounting of the package, the silicon chip is heated. Due to heating, the cracks on the silicon chip may extend. Ultimately, reliability of the product is compromised.

SUMMARY

Some embodiments of the present disclosure provide a semiconductor chip structure, including a substrate having a top surface, a bottom surface, and a lateral surface connecting the top surface and the bottom surface. The lateral surface includes a first portion having a first surface roughness and being in proximity to the top surface, and a second portion having a second surface roughness and being in proximity to the bottom surface. The first surface roughness is greater than the second surface roughness.

Some embodiments of the present disclosure provide a semiconductor package, including a substrate having a top surface and a bottom surface, an active region in proximity to the top surface, and an inactive region surrounding the active region. The inactive region includes a first lateral surface, a second lateral surface, and a peak connecting the first lateral surface and the second lateral surface.

Some embodiments of the present disclosure provide a wafer dicing method. The method includes forming a first trench by applying a laser beam along an inactive region of the wafer to remove a first portion of the inactive region, and forming a second trench by applying a first blade along the first trench to remove a second portion of the inactive region. The inactive region surrounds an active region of the wafer. The second trench partially overlaps with the first trench.

BRIEF DESCRIPTION OF THE DRAWINGS

Aspects of the present disclosure are best understood from the following detailed description when read with the accompanying figures. It should be noted that various features may not be drawn to scale. In fact, the dimensions of the various features may be arbitrarily increased or reduced for clarity of discussion.

FIG. 8A is a cross sectional view of an inactive region and active regions of the semiconductor wafer along line AA' of FIG. 5, in accordance with some embodiments of the present disclosure.

FIG. 8B is an enlarged view showing various portions of metal trace and the semiconductor wafer in the inactive region of FIG. 8A, in accordance with some embodiments of the present disclosure.

FIG. 9A is a cross sectional view of an inactive region and active regions of the semiconductor wafer along line BB' of FIG. 5, in accordance with some embodiments of the present disclosure.

FIG. 9B is an enlarged view showing various portions of the inactive region or saw street in FIG. 9A, in accordance with some embodiments of the present disclosure.

DETAILED DESCRIPTION

Figure 1:
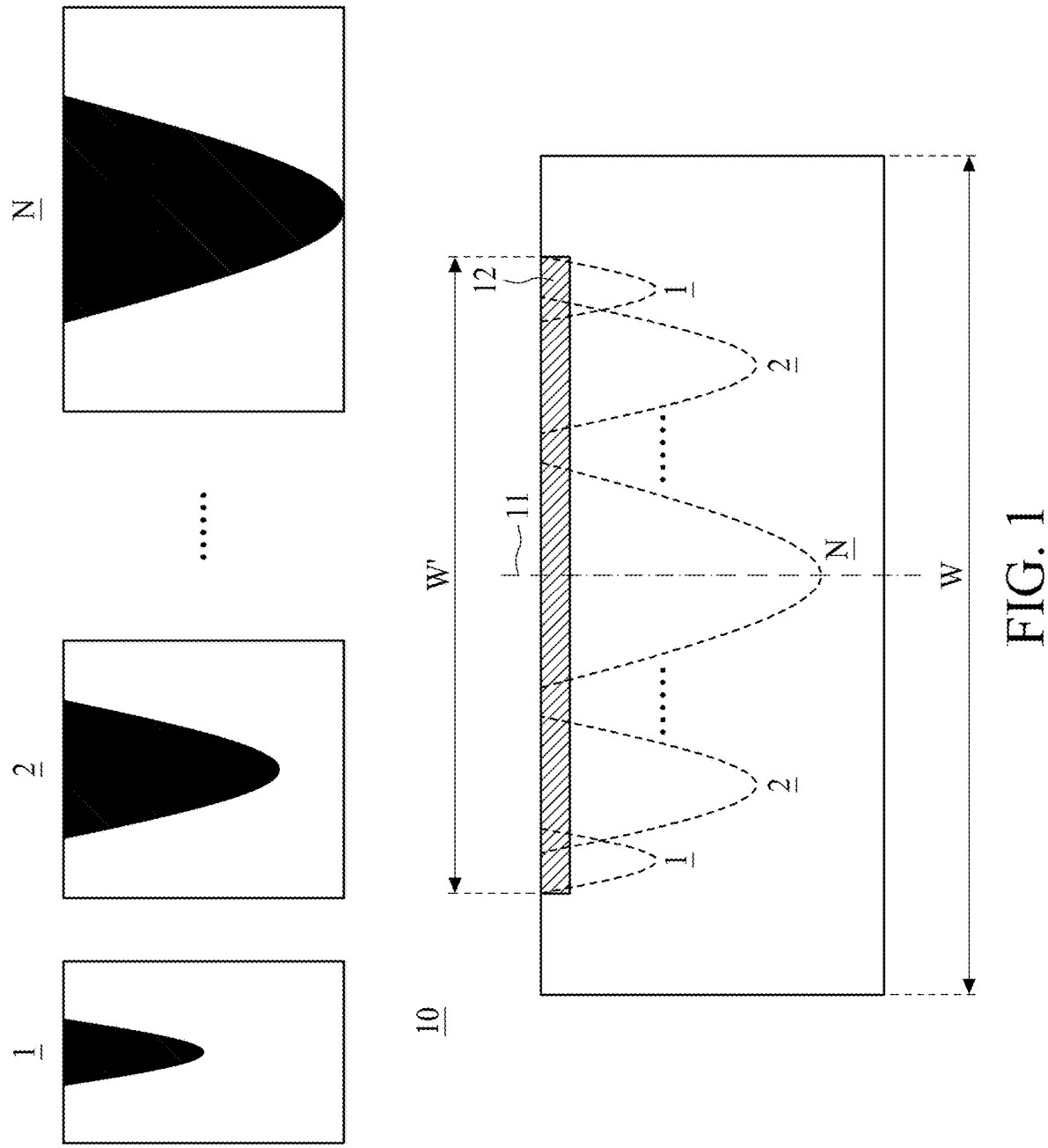
FIG. 1 shows $1^{st}$ to $N^{th}$ laser beam profiles and a superposition of the $1^{st}$ to the $N^{th}$ laser beam profiles on a cross section of a saw street on a wafer having low-k dielectric interconnect structure, in accordance with some comparative embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various chip dicing operations in wafer level chip scale packaging (WLCSP) can be selected. For example, when low-k dielectric material (e.g., relative permittivity smaller than 3) is utilized in proximity to a chip dicing surface, multiple laser grooving operations are applied to the dicing surface and followed by one or more blade saw operation(s). When non low-k dielectric material (e.g., relative permittivity greater than 3) is utilized in proximity to a chip dicing surface, laser grooving operations are omitted. One or more blade saw operation(s) are directly applied on the chip dicing surface. An interconnect structure including low-k dielectric material is more brittle than the interconnect structure including non low-k dielectric material due to the fact that metal lines or metal vias embedded in low-k dielectric material usually have smaller thickness and/or line width than those embedded in non low-k dielectric counterparts. Multiple laser grooving operations are thus performed when dicing a semiconductor wafer with low-k dielectric interconnect structure in order to prevent crack or delamination at the dicing edge as well as surface chipping or peeling at the dicing surface.

A semiconductor wafer with non low-k dielectric interconnect structure, on the other hand, may skip the multiple laser grooving operations and achieve an acceptable crack rate (e.g., less than 10000 ppm) and chipping rate (e.g., less than 5000 ppm) with a reduced number of one or more blade saw operation(s).

In advanced processing nodes (90 nm and beyond), a dielectric in proximity to a chip dicing surface transforms from low-k dielectric material to non low-k dielectric material. In order to achieve an ultra-low crack rate (e.g., approximately 0 ppm) and ultra-low chipping rate (e.g., less than 500 ppm) in a semiconductor wafer with non low-k dielectric interconnect structure, applying the dicing operations of low-k dielectric interconnect structure on the non low-k dielectric interconnect structure indiscriminately generally cannot achieve the goal of ultra-low crack rate and ultra-low chipping rate. More sophisticated operations are thus involved.

In a comparative embodiment as shown in FIG. 1, multiple laser grooving operations are illustrated with respect to the laser beam widths and focused spot diameters. In some embodiments, N laser grooving operations are conducted on a wafer with low-k dielectric interconnect structure prior to subjecting the wafer to blade saw operation. The $1^{st}$ laser grooving utilizes a V-shaped laser beam with narrowest beam width and smallest focused spot diameter. As shown in FIG. 1, subsequent operations apply laser beams having respectively greater beam widths and larger focused spot diameters. An ideal laser grooving profile 10 superimposing the $1^{st}$ to $N^{th}$ laser beams is also illustrated in FIG. 1. In some embodiments, at least one of $1^{st}$ to $N^{th}$ laser beams includes a dual beam, e.g., two substantially identical laser beams whose outer edges are separated by a width W', applied to a chip dicing surface. The positions of the dual beams are symmetric with respect to a kerf line 11 within a saw street possessing a width W. In this comparative embodiment, superposition of the $1^{st}$ to the $N^{th}$ laser beam profiles substantially covers a metal pad 12 exposed at the top of the wafer. The metal pad 12 may be partially embedded, surrounded, or exposed from low-k dielectric material. One purpose of the multiple laser grooving operations is to remove the metal pad 12 at the chip dicing surface, followed by blade saw operations. If the metal pad 12 is partially removed, for example, at an edge of the metal pad 12 by the $1^{st}$ laser grooving operation, and immediately followed by blade saw operation, the sidewall of the blade saw trench would generate cracks and further induce surface peeling.

Figure 2:
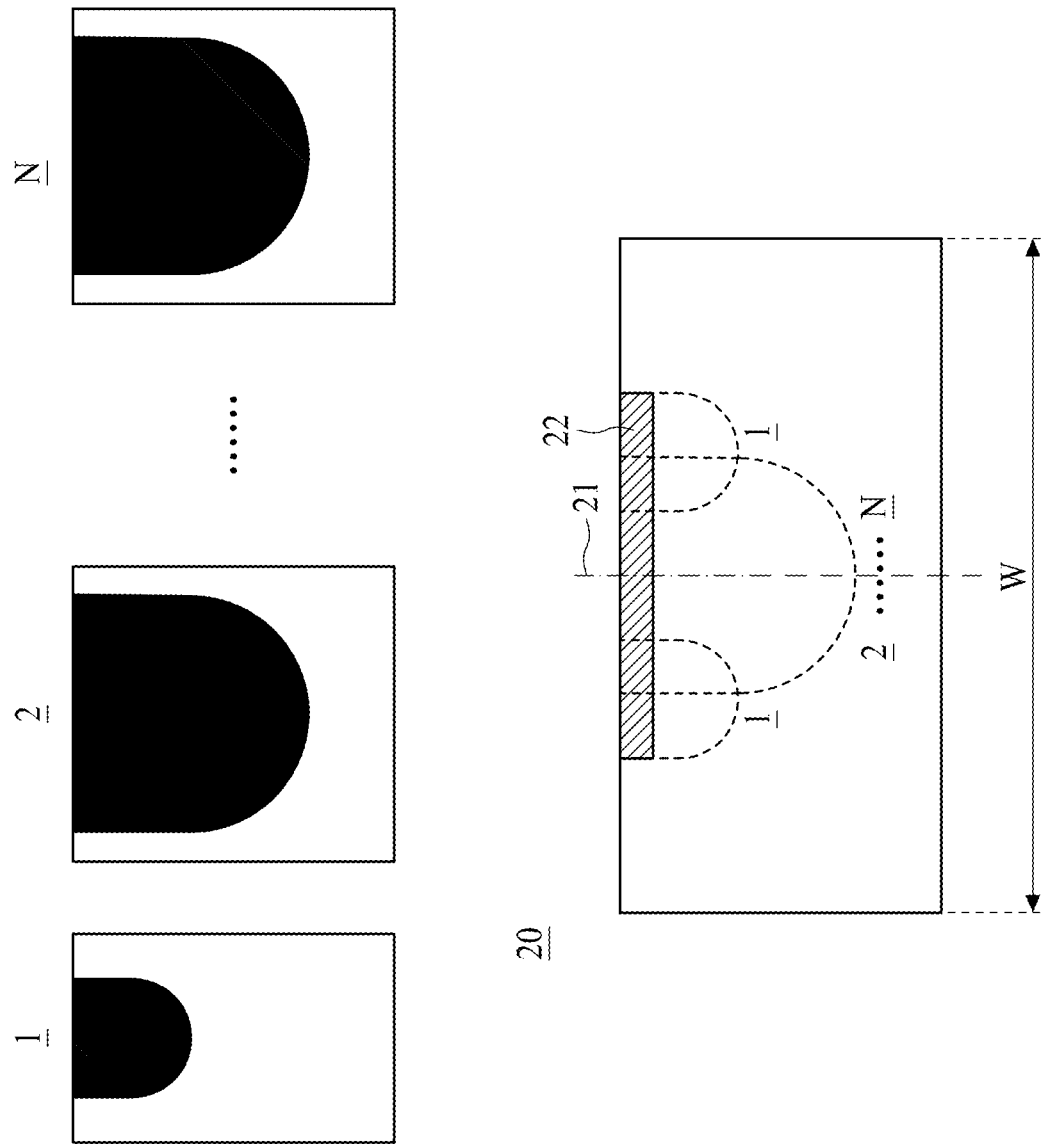
FIG. 2 shows $1^{st}$ to $N^{th}$ laser beam profiles and a superposition of the $1^{st}$ to the $N^{th}$ laser beam profiles on a cross section of a saw street on a wafer having low-k dielectric interconnect structure, in accordance with some comparative embodiments of the present disclosure.

In another comparative embodiment as shown in FIG. 2, multiple laser grooving operations are illustrated with respect to the laser beam widths and focused spot diameters. In some embodiments, N laser grooving operations are conducted on a wafer with low-k dielectric interconnect structure prior to subjecting the wafer to one or more blade saw operation(s). The $1^{st}$ laser grooving utilizes a U-shaped laser beam with narrowest beam width and smallest focused spot diameter. Similar to the $1^{st}$ laser grooving, the $2^{nd}$ to the $N^{th}$ laser grooving may utilize a U-shaped laser beam. In some embodiments, the $2^{nd}$ to the $N^{th}$ laser grooving share the same laser beam profile. For example, the $2^{nd}$ laser grooving applies a laser beam with a power (e.g., 3 W) greater than a power (e.g., 2.5 W) of the $3^{rd}$ laser grooving. The $2^{nd}$ laser grooving is configured to remove the metal pad 22 exposed at the top surface of the wafer using a first wavelength, whereas the $3^{rd}$ laser grooving is configured to passivate the roughened trench surface created by previous grooving operations by using a second wavelength. The first wavelength can be different from the second wavelength. In some embodiments, at least the $1^{st}$ laser beam includes a dual beam applied to a chip dicing surface. The positions of the dual beams are symmetric with respect to a kerf line 21 within a saw street possessing a width W. Similar to FIG. 1, if the metal pad 22 is partially removed, the sidewall of the blade saw trench would generate cracks and further induce surface peeling.

Figure 3:
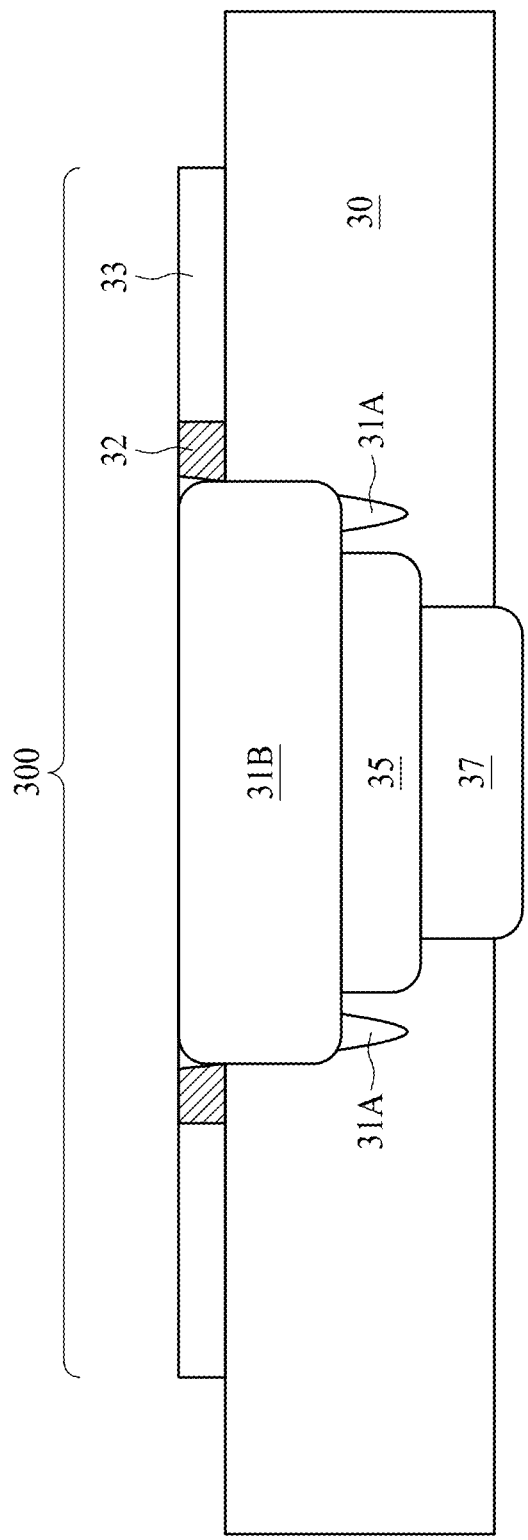
FIG. 3 shows a superposition of multiple laser grooving profiles and multiple blade saw profiles on a cross section of a saw street on a wafer having low-k dielectric interconnect structure, in accordance with some comparative embodiments of the present disclosure.

FIG. 3 superimposes laser grooving profiles and blade saw profiles on a cross section of a saw street 300 of a wafer 30. A metal pad 32 is exposed from a top surface of the wafer 30 and surrounded or partially embedded by low-k dielectric material 33. In some embodiments, a first laser grooving profile 31A with narrowest beam width is positioned proximal to an edge of a metal pad 32, followed by a subsequent laser grooving profile 31B positioned at a center of the metal pad 32. The number of subsequent laser grooving operations may be an arbitrary number, for example, 2, 4, or 5. A first blade saw profile 35 is illustrated to be narrower than the subsequent laser grooving profile 31B. A subsequent blade saw profile 37 is illustrated to be narrower than the first blade saw profile 35. As shown in FIG. 3, the laser grooving profiles 31A, 31B show that the laser grooving operations substantially remove the metal pad 32, and the blade saw profiles 35, 37 show the blade saw operations having blade widths narrower than that of the subsequent laser beam width.

Figure 4:
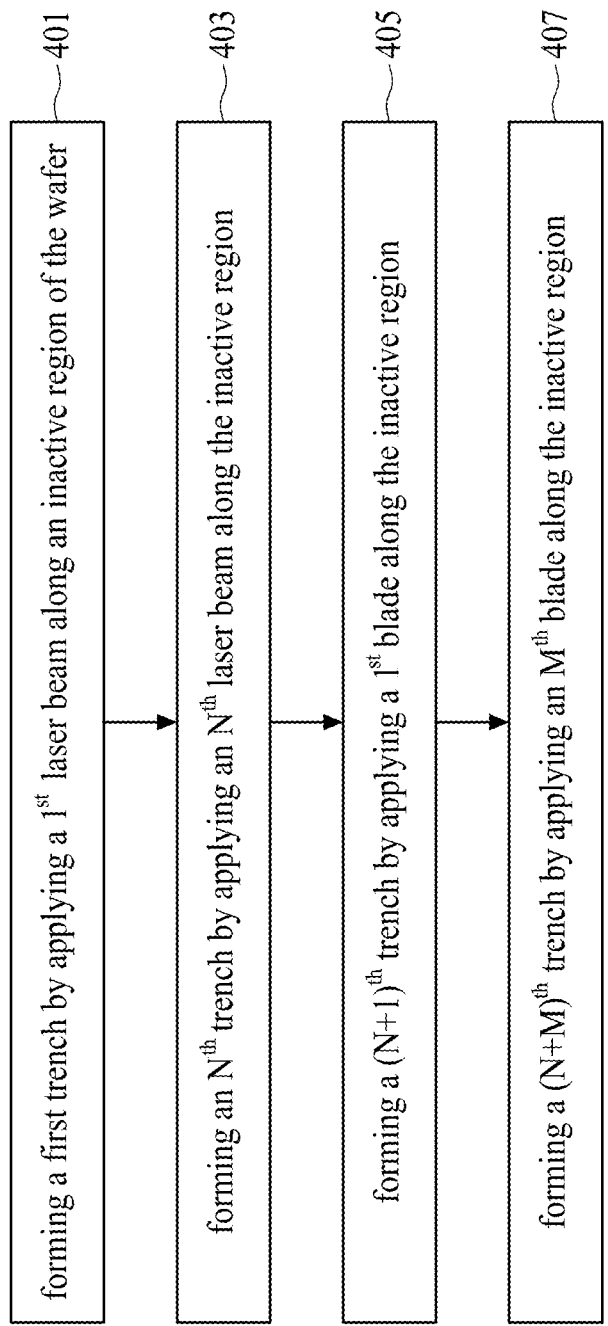
FIG. 4 is a flow diagram showing operations to perform multiple laser grooving operations and multiple blade saw operations, in accordance with some comparative embodiments of the present disclosure.

FIG. 1 to FIG. 3 can be further represented by a process flow shown in FIG. 4. In operation 401, a first laser beam is applied along a saw street, or an inactive region, of a wafer and thereby forming a first trench in the wafer. In operation 403, multiple operations, for example, from $2^{nd}$ to $N^{th}$ laser grooving operations, each similar to those addressed in operation 401 but with different laser beam profiles, powers, or wavelengths, can be conducted on the wafer and therefore multiple trenches, for example, from $2^{nd}$ to $N^{th}$ trenches, can be formed in the wafer. In operation 405, a first blade saw operation with a blade width narrower than that of the $N^{th}$ trench is performed, thereby forming an $(N+1)^{th}$ trench in the wafer. In operation 407, multiple operations, for example, from $2^{nd}$ to $M^{th}$ blade saw operations, each similar to those addressed in operation 405 but with different blade widths can be conducted on the wafer and therefore multiple trenches, for example, from $(N+2)^{th}$ to $(N+M)^{th}$ trenches, can be formed in the wafer.

In FIG. 1 to FIG. 4, performing multiple laser grooving operations prior to one or more blade saw operation(s) effectively decrease the crack rate or chipping rate as opposed to the scenario where one laser grooving is applied and immediately followed by blade saw operations. However, when the dicing operations previously discussed in FIG. 1 to FIG. 4 are applied to a semiconductor wafer having non low-k dielectric interconnect structure, the ultra-low crack rate (e.g., approximately 0 ppm) and ultra-low chipping rate (e.g., less than 500 ppm), according to advanced device specification, generally cannot be achieved due to excess thermal stress accumulation during multiple laser grooving operations. Thermal stress could degrade a material's mechanical properties and generate lateral stress at chip edges. When a blade cuts through the saw street adjacent to the chip edges, the accumulated lateral stress can cause the sidewall at the chip edges to crack or delaminate, or the surface at the chip edges to chip or peel off.

Some embodiments also provide a method for achieving ultra-low crack rate (e.g., approximately 0 ppm) and ultra-low chipping rate (e.g., less than 500 ppm) in non low-k material setting. One dual laser grooving operation is conducted prior to the one or more blade saw operation(s). The dual laser grooving discontinues a metal pad on a dicing surface by a dual laser grooving trench without generating excess thermal stress. The subsequent blade operation passes the portion of the metal pad defined by the dual laser grooving trench. Fewer laser grooving operations than those described in the comparative embodiments of FIG. 1 to FIG. 4 decreases operation cost and raise production throughput. The aforesaid method can also be applied on low-k materials. Corresponding dicing features left on the saw street will also be described in detail.

Figure 5:
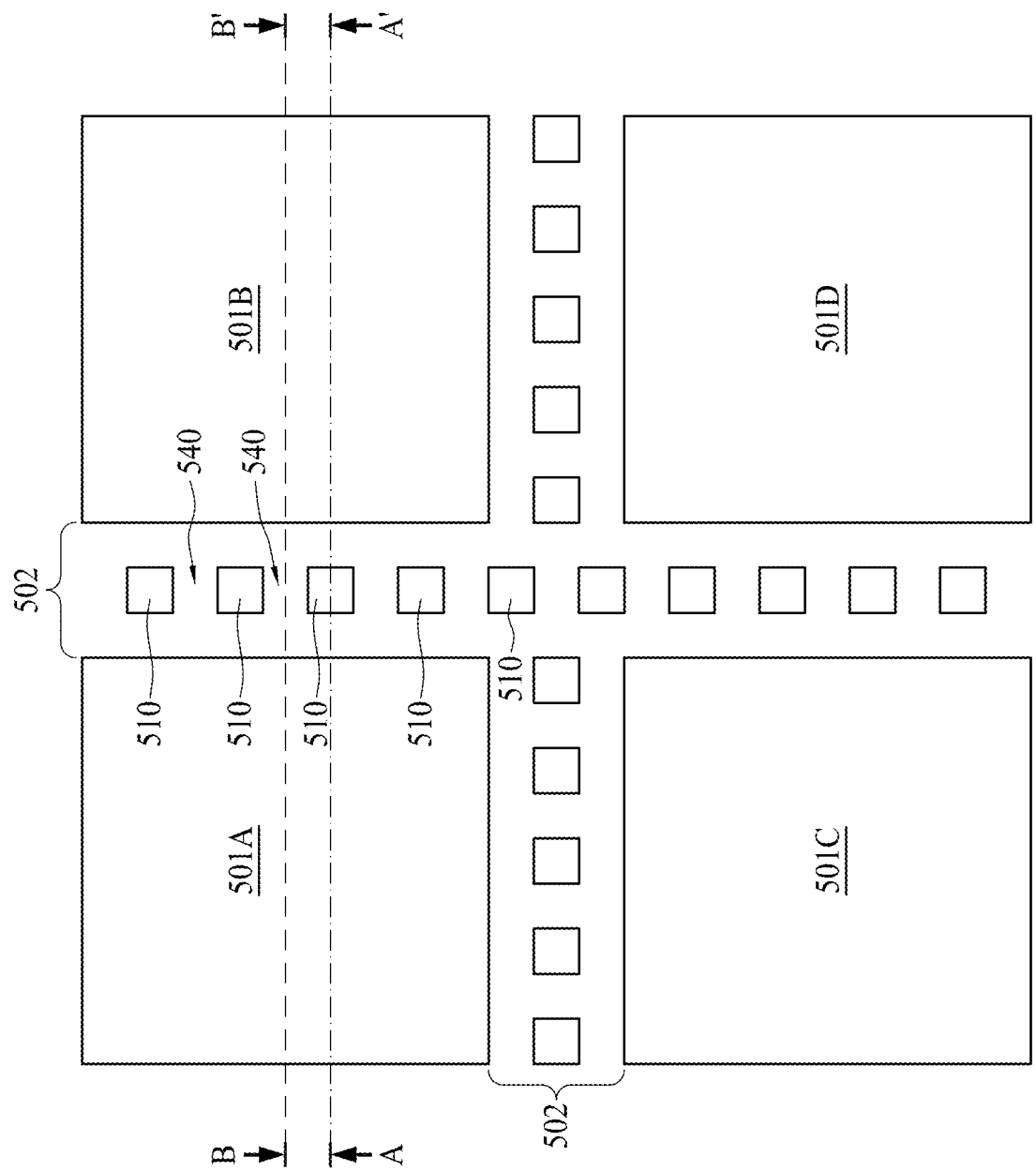
FIG. 5 is a top view showing multiple active regions and inactive regions on a semiconductor wafer surface having low-k or non low-k interconnect structures, in accordance with some embodiments of the present disclosure.

FIG. 5 is a top view showing multiple active regions and inactive regions on a semiconductor wafer surface having low-k or non low-k interconnect structures, in accordance with some embodiments of the present disclosure. In FIG. 5, two intercrossing inactive regions 502 separate several active regions 501A, 501B, 501C, and 501D on the semiconductor wafer. Active region, or die region, includes fabricated semiconductor devices ready to be singulated, whereas the inactive regions are the saw streets between each of the active regions. A plurality of metal trace 510 of metal pads can be positioned on the inactive region for alignment or testing purposes. Cross sectional views along line AA' and line BB' are further depicted in FIG. 8A and FIG. 9. Line AA' traverses across two active regions 501A, 501B and a metal trace 510 in the inactive region 502. Line BB' traverses across two active regions 501A, 501B without passing any metal traces 510 in the inactive region. Instead, line BB' passes through a spacing 540 between adjacent metal traces 510. The spacing 540 can be composed of semiconductor substrate 500, non low-k dielectric material, and/or low-k dielectric material. In some embodiments, laser beams with predetermined beam widths, wavelengths, and focused spot diameters scan along the inactive region 502 or saw street, followed by one or more blade saw operation(s) which also cut through the inactive region 502 or saw street, rendering the active regions intact and singulated. In some embodiments, the laser grooving operation uses a pulse argon laser light source which is focused on a first portion of the metal trace 510 and scans over the saw street. The pulse argon laser light source, for example, creates a plurality of grooving holes along the inactive region 502 or saw street, and when the plurality of grooving holes partially overlap with each other, a laser grooving trench can be obtained.

Figure 6:
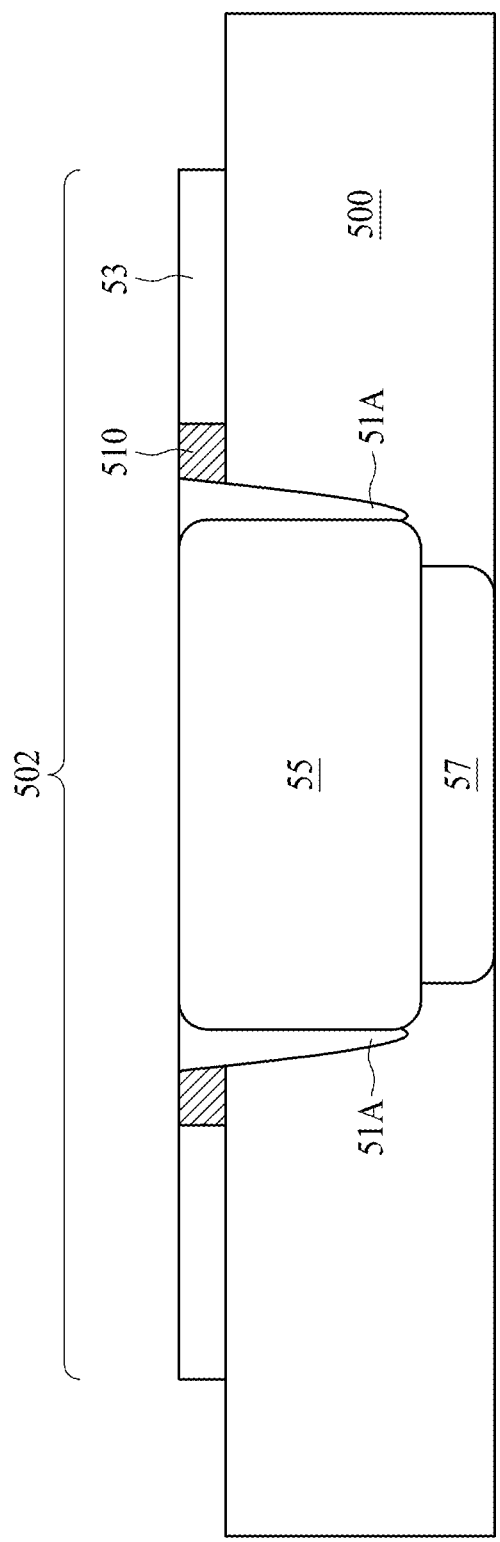
FIG. 6 shows a superposition of one laser grooving profile and multiple blade saw profiles on a cross section of a saw street on a wafer having non low-k dielectric interconnect structure, in accordance with some embodiments of the present disclosure.

FIG. 6 shows a superposition of one laser grooving profile 51A and multiple blade saw profiles 55, 57 on a cross section of a saw street 502 on a wafer 500 having non low-k dielectric interconnect structure, in accordance with some embodiments of the present disclosure. A metal trace 510 (e.g., metal pad, metal line) is exposed from a top surface of the wafer 500 and surrounded or partially embedded by non low-k dielectric material 53. In some embodiments, a laser grooving profile 51A with dual laser beam profile is proximal to both edges of a metal trace 510. A first blade saw profile 55 partially overlaps the dual laser beam profile at both edges of the metal trace 510. A second blade saw profile 57 is illustrated to be narrower than the first blade saw profile 55. As shown in FIG. 6, the laser grooving profile 51A shows that laser grooving operation selectively removes opposing edges of the metal trace 510, and the blade saw profiles 55, 57 show that blade saw operation substantially removes the portion of the metal trace 510 between the dual laser grooving profile.

Figure 7:
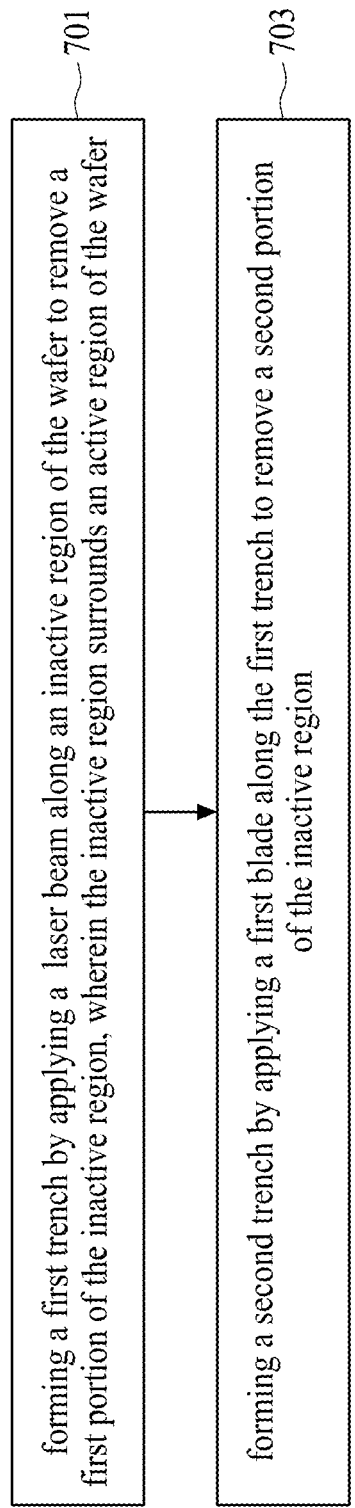
FIG. 7 is a flow diagram showing operations to perform one laser grooving operation and multiple blade saw operations, in accordance with some embodiments of the present disclosure.

FIG. 6 can be further represented by a process flow shown in FIG. 7. FIG. 7 is a flow diagram showing operations to perform one laser grooving operation and multiple blade saw operations, in accordance with some embodiments of the present disclosure. In operation 701, a first laser beam is applied along a saw street, or an inactive region, of a wafer and thereby forms a first trench in the wafer. When the first laser beam possesses a dual laser beam, dual laser trenches symmetric to a kerf line in the saw street of the wafer are formed. In operation 703, a first blade saw operation with a blade width narrower than a separation of the dual laser trenches is performed, thereby forming a second trench in the wafer. Multiple operations, for example, from $2^{nd}$ to $M^{th}$ blade saw operations, each similar to those addressed in operation 703 but with different blade widths can be conducted on the wafer and therefore multiple trenches, for example, from $2^{nd}$ to $M^{th}$ trenches, can be formed in the wafer.

FIG. 8A is a cross sectional view of an inactive region 502 and active regions 501A, 501B of the semiconductor wafer along line AA' of FIG. 5, in accordance with some embodiments of the present disclosure. Line AA' of FIG. 5 traverses a metal trace 510 on the saw street or inactive region 502 and two active regions 501A, 501B surrounding the saw street. Each of the active regions 501A, 501B may possess a protection layer 521 covering a redistribution layer (RDL) 520. The RDL 520 includes metal traces partially embedded, surrounded, or exposed from dielectric layers, wherein the metal traces of the RDL are electrically coupled to the underlying device interconnect structure and device active regions. The protection layer 521 over the RDL 520 can be composed of polymeric materials such as Polybenzoxazole (PBO). Conductive terminals such as solder paste or solder bumps have access to the RDLs through openings of the protection layers 521. As illustrated in FIG. 8A, seal ring structure 530 can be positioned at boundaries of the active regions 501A, 501B.

FIG. 8B is an enlarged view showing various portions of the metal pad 510 and the semiconductor wafer 500 in the inactive region 502 of FIG. 8A, in accordance with some embodiments of the present disclosure. During operation 701 of the present disclosure, a first trench is formed by applying a dual laser beam along the inactive region 502 of the wafer 500 to remove a first portion 510A of the inactive region 502. The first portion 510A is depicted by dotted lines in FIG. 8B. In some embodiments, the first portion 510A includes a portion of the metal trace 510 in the inactive region 502 and a portion of the semiconductor wafer 500. For example, when a dual laser beam is focused and applied at edges of the metal trace 510, the portion of the metal trace 510 and a portion of the wafer 500 under the metal trace 510 are removed. Depending on the power of the laser applied, the shape of the first portion 510A resembles parabolas with various axis lengths. Applying a laser with higher power, a parabola with a longer axis can be obtained and vice versa. However, the laser power should be controlled to remove a portion of the metal trace in the first portion 510A completely, that is, to discontinue the metal trace 510.

During operation 703, a second trench is formed by applying a first blade along the first trench to remove a second portion 510B of the inactive region 502. The second portion 510B is depicted by dash-dot lines in FIG. 8B. A width of the first blade is selected to be narrower than a separation of the vertices A at the bottom of the first portion 510A. In operation 703, the second portion 510B is removed without affecting a third portion 510C of the inactive region 502, that is, the portion including at least an edge of the metal trace 510.

FIG. 9A is a cross sectional view of an inactive region 502 and active regions 501A, 501B of the semiconductor wafer along line BB' of FIG. 5, in accordance with some embodiments of the present disclosure. Line BB' of FIG. 5 traverses the inactive region 502 or the spacing 540 between metal traces 510 and two active regions 501A, 501B surrounding the inactive region 502 or the saw street. Each of the active regions 501A, 501B may possess a protection layer 521 covering a redistribution layer (RDL) 520. The RDL 520 includes metal traces partially embedded, surrounded, or exposed from dielectric layers, wherein the metal traces of the RDL are electrically coupled to the underlying device interconnect structure and device active regions. Protection layer 521 over the RDL 520 can be composed of polymeric materials such as Polybenzoxazole (PBO). Conductive terminals such as solder paste or solder bumps have access to the RDLs through openings of the protection layers 521. As illustrated in FIG. 9, seal ring structure 530 can be positioned at boundaries of the active regions 501A, 501B.

FIG. 9B is an enlarged view showing the inactive region 502 of FIG. 9A, in accordance with some embodiments of the present disclosure. During operation 701 of the present disclosure, a first trench is formed by applying a dual laser beam along the inactive region 502 of the wafer 500 to remove a first portion 540A of the inactive region 502. The first portion 540A is depicted by dotted lines in FIG. 9B. In some embodiments, the first portion 540A includes a portion of the semiconductor wafer 500 in the inactive region 502. For example, when a dual laser beam is focused and applied at the inactive region 502, the first portion 540A of the inactive region 502 having a parabola cross section is removed. Depending on the power of the laser applied, the shape of the first portion 540A resembles parabolas with various axis lengths. Applying a laser with higher power, a parabola with a longer axis can be obtained and vice versa.

During operation 703, a second trench is formed by applying a first blade along the first trench to remove a second portion 540B of the inactive region 502. The second portion 540B is depicted by dash-dot lines in FIG. 9B. A width of the first blade is selected to be narrower than a separation of the vertices A at the bottom of the first portion 540A. In operation 703, the second portion 540B is removed without affecting a third portion 540C of the semiconductor wafer that is at an opposite side of the first portion 540A with respect to the second portion 540B.

Figure 10:
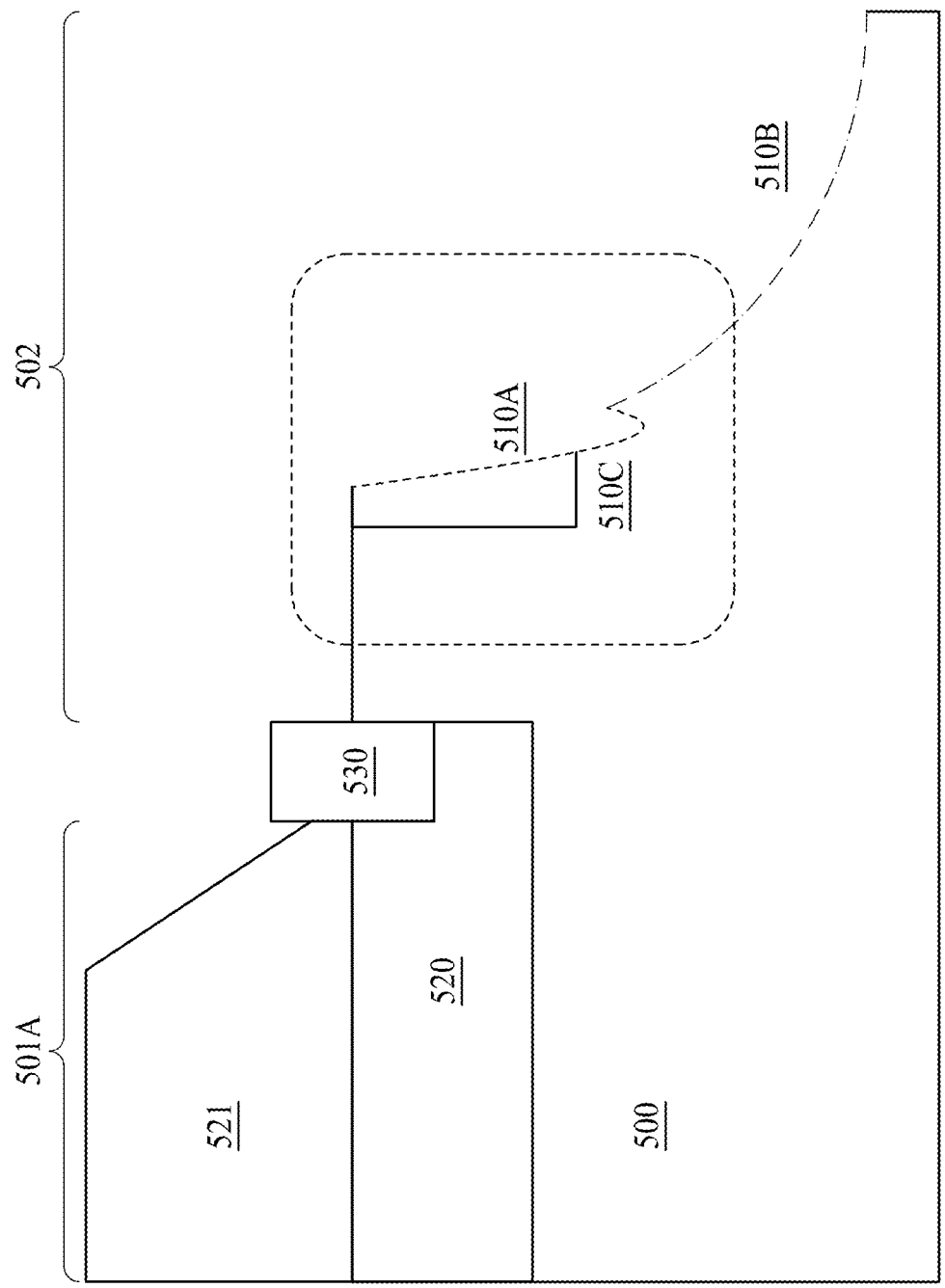
FIG. 10 is an enlarged cross sectional view of an active region and an inactive region of a semiconductor wafer after a laser grooving operation and a blade saw operation, in accordance with some embodiments of the present disclosure.

FIG. 10 is an enlarged cross sectional view of an active region 501A and an inactive region 502 of a semiconductor wafer after a laser grooving operation and a blade saw operation, in accordance with some embodiments of the present disclosure. The cross sectional view of FIG. 10 is along line AA' of FIG. 5. The first portion 510A in the inactive region 502 is removed by the laser grooving operation and contoured by dotted lines. The second portion 510B is removed by the blade saw operation and contoured by dash-dot lines. An edge of the metal trace in the third portion 510C, is spaced from the seal ring structure 530, the protection layer 521, and the RDL 520. The seal ring structure 530 is configured to protect the circuit in the active region 501A from abnormal currents and therefore extends from a top surface of the wafer 500 downward to device active regions. The seal ring structure 530 can be included in the active region 501A or independent from either the active region 501A or the inactive region 502. An enlarged view of the first portion 510A, the second portion 510B, and the third portion 510C of FIG. 10 are further illustrated in FIG. 11A.

Figure 11A:
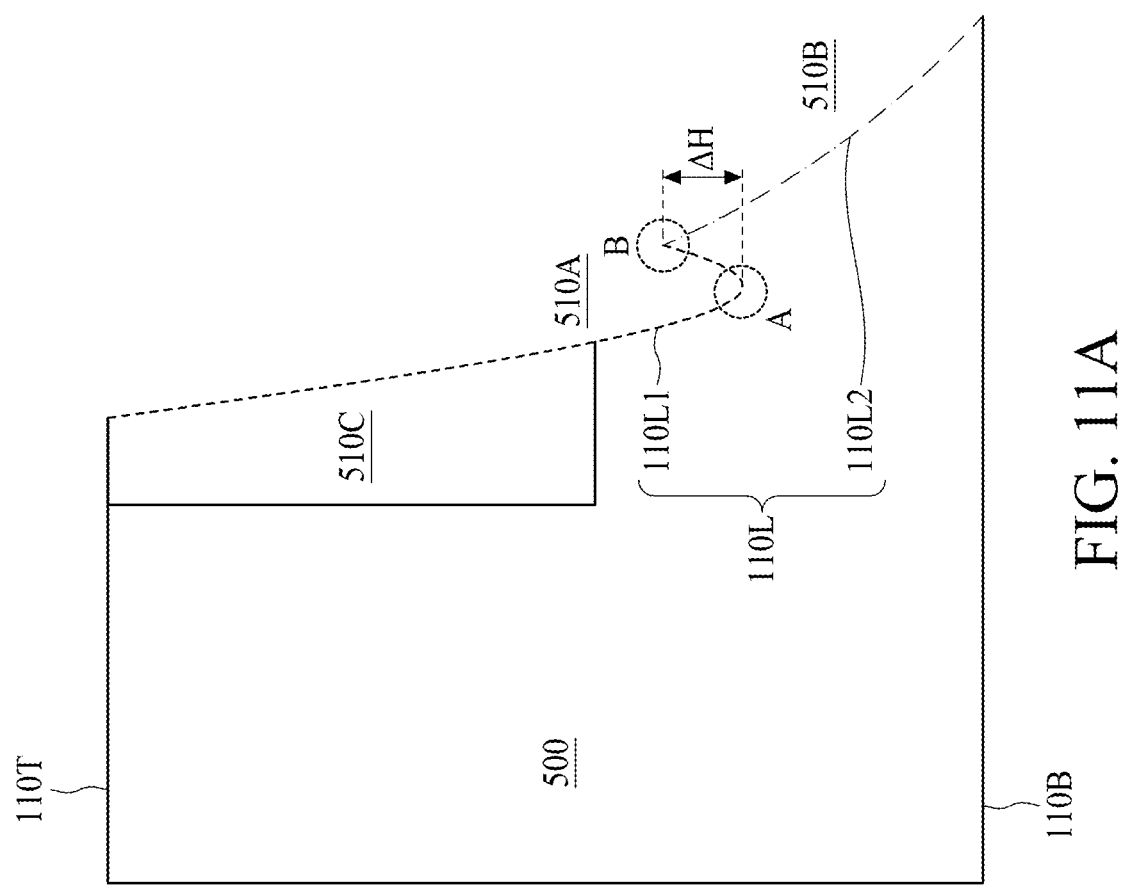
FIG. 11A is an enlarged cross sectional view of an inactive region of a semiconductor wafer after a laser grooving operation and a blade saw operation, in accordance with some embodiments of the present disclosure.

In FIG. 11A, the semiconductor wafer 500 includes a top surface 110T, a bottom surface 110B, and a lateral surface 110L connecting the top surface 110T and the bottom surface 110B. The lateral surface 110L can include a first contour surface 110L1 of the first portion 510A of the semiconductor wafer 500 being removed and a second contour surface 110L2 of the second portion 510B of the semiconductor wafer 500 being removed. More contour surfaces can be presented in the semiconductor wafer 500 connecting the top surface 110T and the bottom surface 110B, as will be discussed in FIG. 12 of the present disclosure. In FIG. 11A, the first contour surface 110L1 resembles a partial parabola having a vertex A at a lowest point of the first contour surface 110L1. The second contour surface 110L2 resembles a curve segment connecting the first contour surface 110L1 and the bottom surface 110B. A joint B of the first contour surface 110L1 and the second contour surface 110L2 is the highest point of the second contour surface 110L2. Because the second portion 510B being removed is not overlapping with the vertex A of the first contour surface 110L1, a vertical distance between the joint B and the top surface 110T is shorter than a vertical distance between the vertex A and the top surface 110T. A vertical separation ΔH between the vertex A and the joint B can be observed in some embodiments of the present disclosure. The joint B appears as a singular peak along the lateral surface 110L.

As shown in FIG. 11A, the metal trace in the third portion 510C is in contact with the first contour surface 110L1. Because the laser grooving operation discontinues the metal trace 510 at its edge, a bottom of the metal trace 510, or the bottom of the remaining metal trace 510, is above the vertex A of the first contour surface 110L1. In some embodiments, the joint B at the second contour surface 110L2 may or may not be leveled with the bottom of the remaining metal trace 510, that is, the joint B can be higher or lower than the bottom of the remaining metal trace 510. Although not illustrated in FIG. 11A, the metal trace 510 may be partially embedded, surrounded, or exposed from non low-k dielectric material (e.g., relative permittivity greater than 3) or low-k dielectric material (e.g., relative permittivity smaller than or equal to 3) that constitutes an integral portion of the semiconductor wafer 500.

Figure 11B:
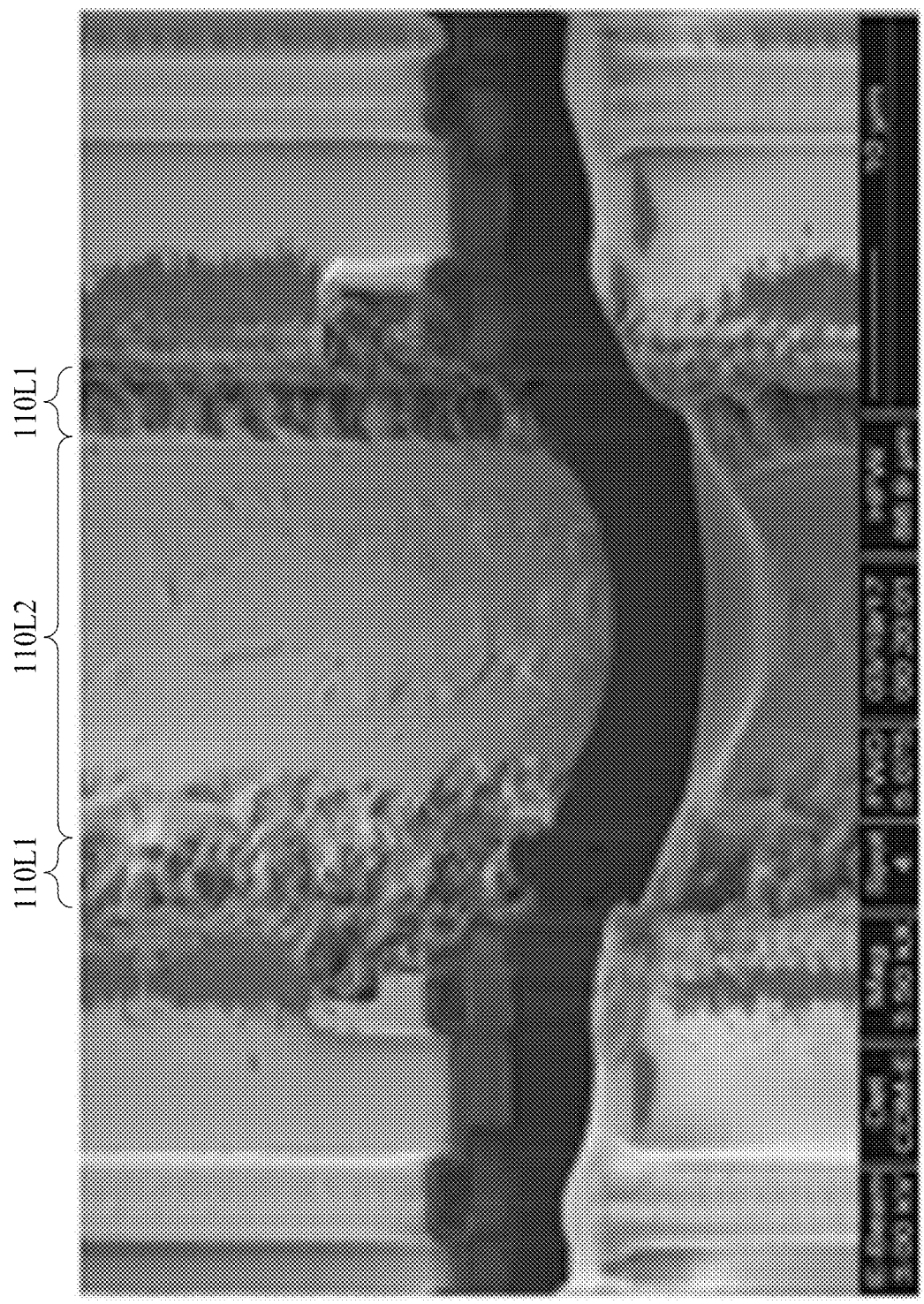
FIG. 11B is a perspective view of an inactive region of a semiconductor wafer after a laser grooving operation and a blade saw operation captured by scanning electron microscope, in accordance with some embodiments of the present disclosure.

In some embodiments, a roughness of the first contour surface 110L1 is different from a roughness of the second contour surface 110L2 due to the fact that the first portion 510A is removed by a laser grooving operation, whereas the second portion 510B is removed by a blade saw operation. As shown in FIG. 11B, FIG. 11B is a perspective view of an inactive region of a semiconductor wafer after a laser grooving operation and a blade saw operation captured by scanning electron microscope, in accordance with some embodiments of the present disclosure. A surface roughness at the first contour surface 110L1 is greater than a surface roughness at the second contour surface 110L2 because in some embodiments, the laser grooving operation is conducted by pulse argon laser scanning along the inactive region 502 of the saw street, thereby creating a series of laser holes partially overlapping with each other. The trench surface created under such condition is rougher than the trench surface created by a blade saw operation, in which a blade directly presses down to predetermined locations on the inactive region 502 or the saw street.

Figure 12:
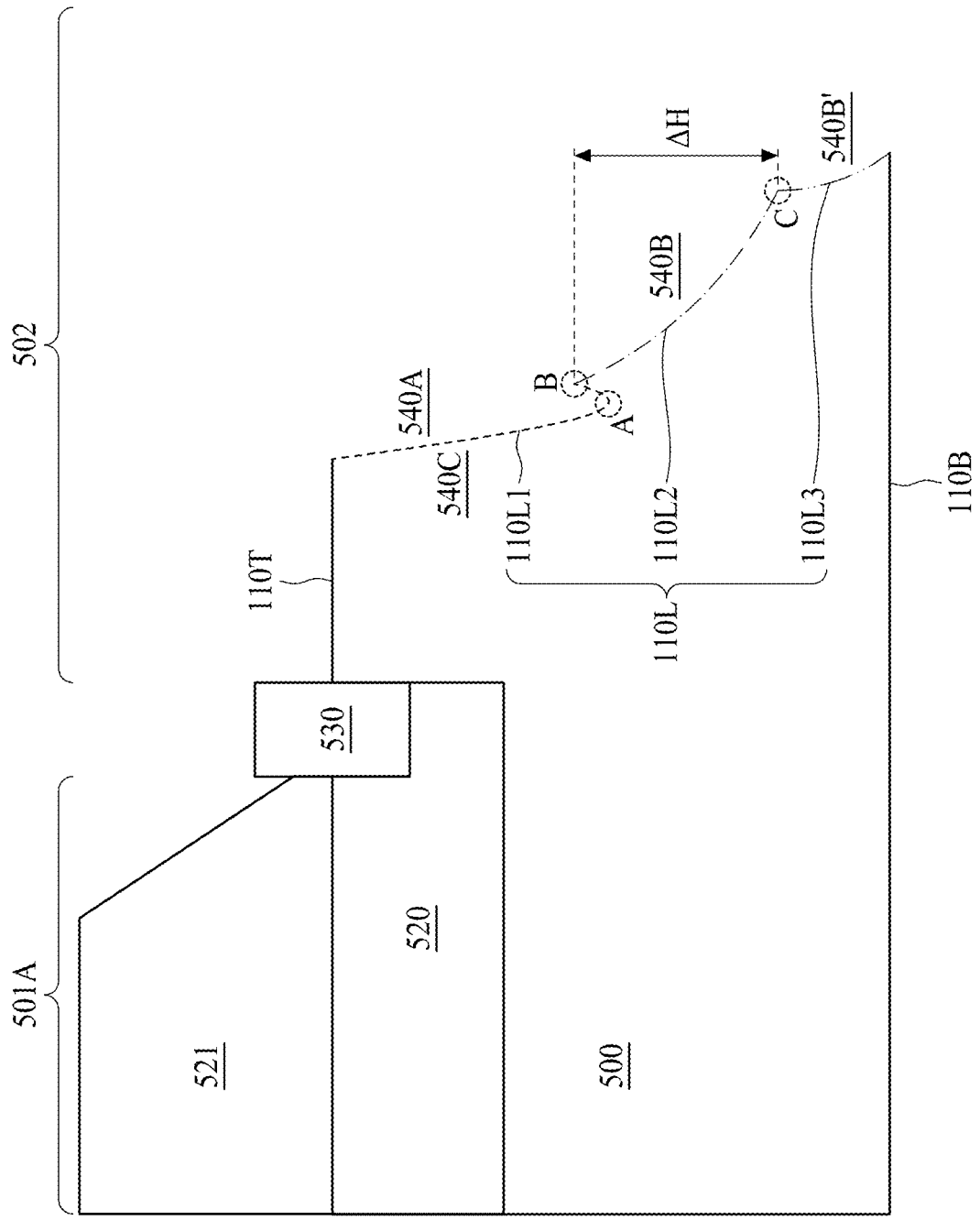
FIG. 12 is a cross sectional view of an inactive region of a semiconductor wafer after a laser grooving operation and multiple blade saw operations, in accordance with some embodiments of the present disclosure.

FIG. 12 is a cross sectional view of an inactive region of a semiconductor wafer 500 after a laser grooving operation and multiple blade saw operations, in accordance with some embodiments of the present disclosure. The cross sectional view of FIG. 12 is along line BB' of FIG. 5. In FIG. 12, the semiconductor wafer 500 includes a top surface 110T, a bottom surface 110B, and a lateral surface 110L connecting the top surface 110T and the bottom surface 110B. The lateral surface 110L can include a first contour surface 110L1 of the first portion 540A of the semiconductor wafer 500 being removed, a second contour surface 110L2 of the second portion 540B of the semiconductor wafer 500 being removed, and a third contour surface 110L3 of a second extension portion 5403 of the semiconductor wafer 500 being removed. In FIG. 12, the first contour surface 110L1 resembles a partial parabola having a vertex A at a lowest point of the first contour surface 110L1. The second contour surface 110L2 resembles a curve segment connecting the first contour surface 110L1 and the third contour surface 110L3. A joint B of the first contour surface 110L1 and the second contour surface 110L2 is the highest point of the second contour surface 110L2. Because the second portion 540B being removed is not overlapping with the vertex A of the first contour surface 110L1, a vertical distance between the joint B and the top surface 110T is shorter than a vertical distance between the vertex A and the top surface 110T. A vertical separation ΔH between the vertex A and the joint B can be observed in some embodiments of the present disclosure. The joint B appears as a first singular peak along the lateral surface 110L. The third contour surface 110L3 resembles a curve segment connecting the second contour surface 110L2 and the bottom surface 110B. A joint C of the second contour surface 110L2 and the third contour surface 110L3 can be a second singular peak along the lateral surface 110L. Because a second blade width used in the second blade saw operation is narrower than a first blade width used in the first blade saw operation, a lateral distance between the joint B and the vertex A is shorter than a lateral distance between the joint C and the vertex A.

Figure 13:
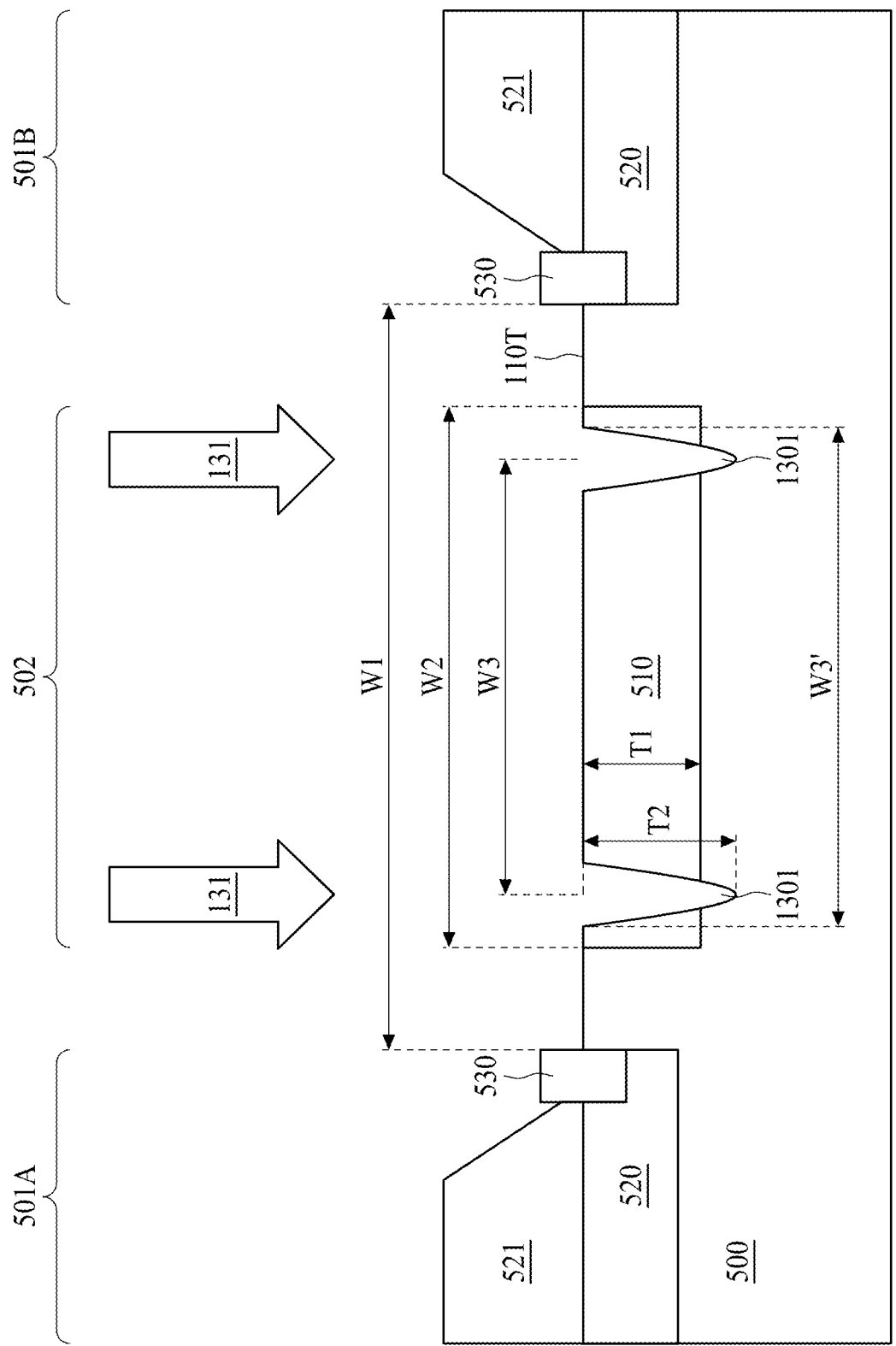
FIG. 13 is a cross sectional view of an inactive region of a semiconductor wafer after a laser grooving operation, in accordance with some embodiments of the present disclosure.

FIG. 13 is a cross sectional view of an inactive region of a semiconductor wafer after a laser grooving operation as described in operation 701, in accordance with some embodiments of the present disclosure. A semiconductor wafer 500 includes a metal trace 510 in proximity to a top surface 110T in the inactive region 502 of the semiconductor wafer 500. A width W1 of the inactive region 502 can be a separation between the seal ring structures 530 of adjacent active regions 501A, 501B. A width W2 of the metal trace 510 is smaller than the width W1. A first trench 1301 is formed in the inactive region 502 by applying a laser beam 131 along the inactive region 502 or the saw street. Referring back to FIG. 8B, a first portion 510A of the inactive region 502 is removed, thereby forming a first trench 1301. The first portion 510A may include a portion of the metal trace 510 where the laser beam is focused on and a portion of the semiconductor wafer 500 or the dielectric material surrounding the metal trace 510. In some embodiments, the laser grooving operation uses a dual laser beam, in which each beam is focused at an edge of the metal trace 510. Each beam of the dual laser beam is applied with a suitable power and wavelength so as to render a first trench having a desired trench height T2. In some embodiments, the trench height T2 is greater than a thickness T1 of the metal trace 510 in order to discontinue the metal trace 510. In some embodiments, the trench height T2 is a vertical distance between the top and the bottom of the trench, ranging from about 8 μm to about 17 The trench height T2 may pass through the bottom of the metal trace 510 and other metal traces underneath the metal trace 510.

A distance W3 between the beams of the dual beam is measured from the vertex in the left trench formed by the left beam to the vertex in the right trench formed by the right beam. The first trench 1301 formed by dual beam argon laser, for example, possesses a tapered shape from a cross section perspective, that is, a top of the first trench 1301 is wider than a bottom of the first trench 1301. A separation W3' between the beams of the dual beam is measured from an exterior side at the top of the left trench to an exterior side at the top of the right trench. The separation W3' is greater than the distance W3 between the beams of the dual beam.

Figure 14:
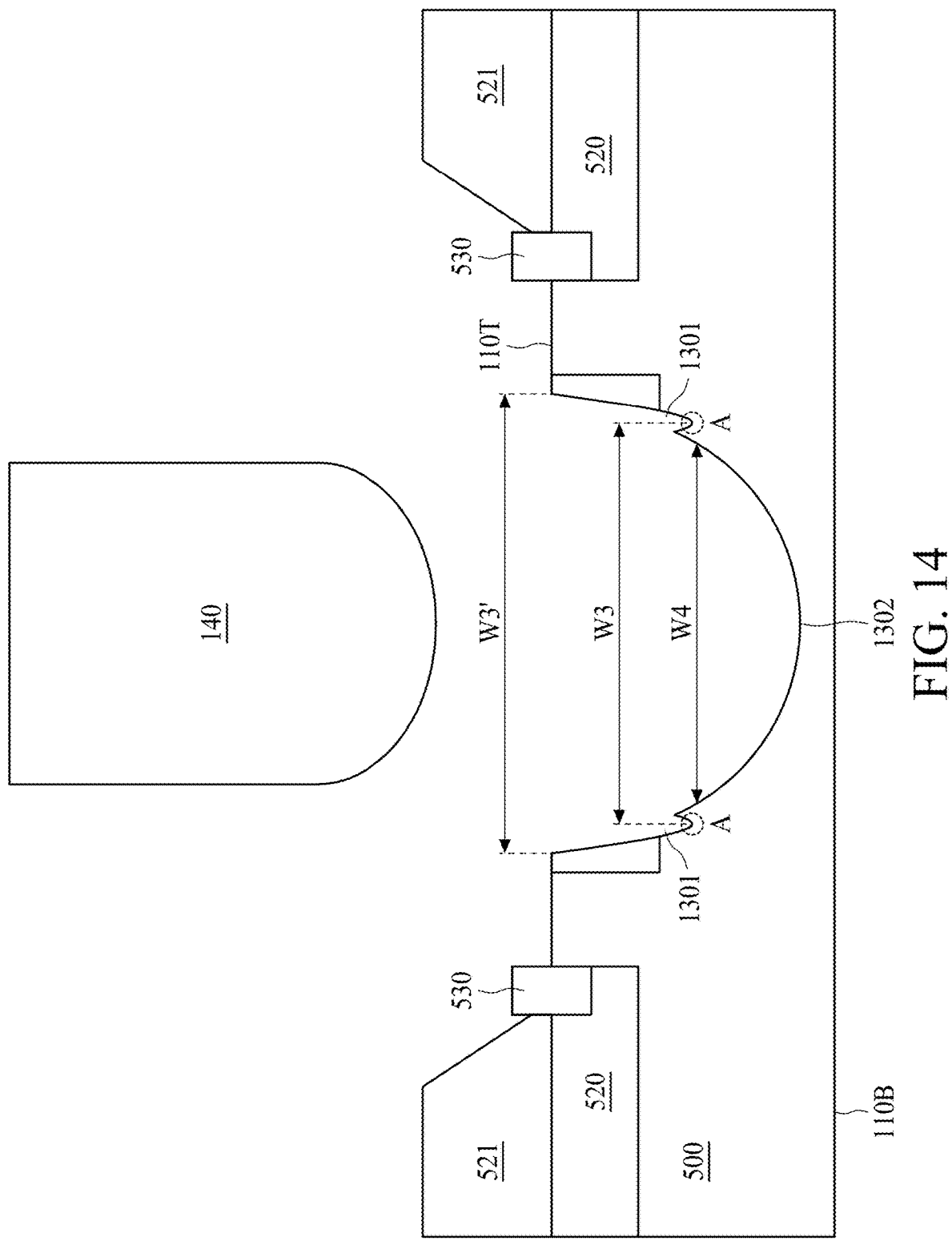
FIG. 14 is a cross sectional view of an inactive region of a semiconductor wafer after a laser grooving operation and a blade saw operation, in accordance with some embodiments of the present disclosure.

FIG. 14 is a cross sectional view of an inactive region of a semiconductor wafer after a laser grooving operation and a blade saw operation as described in operations 701 and 703, in accordance with some embodiments of the present disclosure. A second trench 1302 is formed in the inactive region 502 by applying a first blade 140 along the inactive region 502 or the saw street. Referring back to FIG. 8B, a second portion 510B of the inactive region 502 is removed, thereby forming a second trench 1302. The second portion 510B may include the portion of the metal trace 510 where the first blade 140 is pressed upon and a portion of the semiconductor wafer 500 or the dielectric material surrounding the metal trace 510. In some embodiments, the first blade saw operation uses a blade having a first blade width W4 narrower than the distance W3 of the dual laser beam. In some embodiments, the first blade width W4 is substantially identical to the widest portion of the second trench 1302. As discussed in FIG. 11A, the second contour surface 110L2 is free from overlapping with the vertex A of the first contour surface 110L1, therefore, the first blade width W4 should be narrow enough to prevent the blade saw operation from removing a portion of the wafer 500 directly under the vertex A. If the first blade width W4 is narrower than the distance W3, the second trench 1302 is partially overlapping with the first trench 1301 to an extent that the vertex A of the first trench can still be identified after the first blade saw operation.

In some embodiments, the distance W3 of the dual laser beam can be controlled to be approximately 32 μm for example, and a focused spot diameter or a beam width of one of the beams of the dual laser beam can be about approximately 9 μm for example. A separation W3' of the dual laser beam can be the sum of W3 and two times half the laser beam width, approximately 41 μm in the current embodiment. In some embodiments, the first blade width W4 can be selected to range between approximately 0.6 to 0.8 times of the separation W3', in order to avoid the second trench 1302 from overlapping with the vertex A of the first trench 1301.

During the first blade saw operation, at least a portion of the metal trace 510 is removed from the inactive region 502. When a single one blade saw operation is conducted prior to the completion of the singulation, the second trench 1302 passes through the wafer 500, forming a side surface connecting the top surface 110T and the bottom surface 110B.

Figure 15:
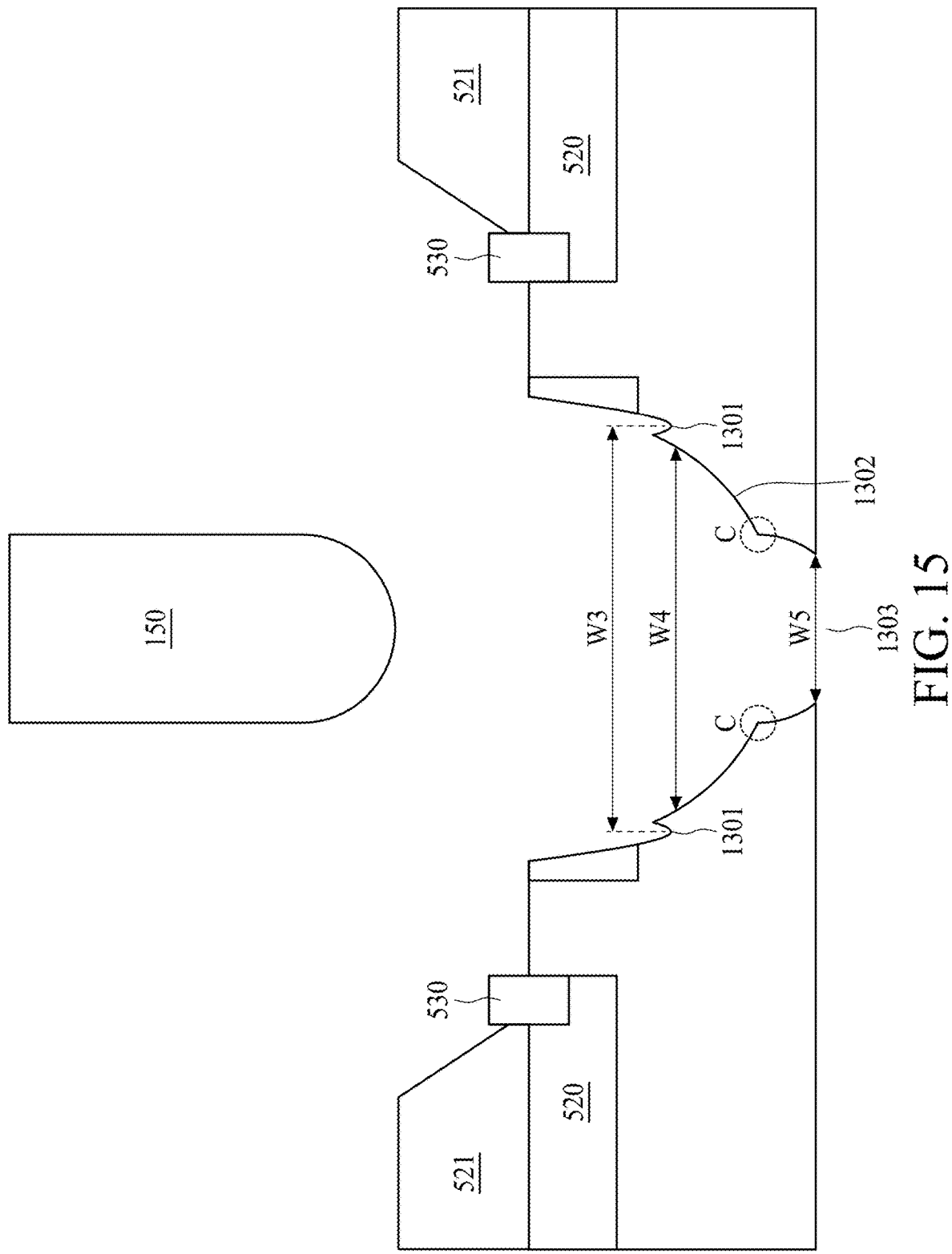
FIG. 15 is a cross sectional view of an inactive region of a semiconductor wafer after a laser grooving operation and two blade saw operations, in accordance with some embodiments of the present disclosure.

FIG. 15 is a cross sectional view of an inactive region of a semiconductor wafer after a laser grooving operation and two blade saw operations, in accordance with some embodiments of the present disclosure. A third trench 1303 is formed in the inactive region 502 by applying a second blade 150 along the inactive region 502 or the saw street. Referring back to FIG. 12, a second extension portion 540B' of the inactive region 502 is removed, thereby forming a third trench 1303, as illustrated in FIG. 15. The second extension portion 540B' may include a portion of the semiconductor wafer 500 or the dielectric material surrounding the metal trace 510 where the second blade 150 is pressed upon. In some embodiments, the second blade saw operation uses a blade having a second blade width W5 narrower than the first blade width W4. The second blade width W5 is substantially identical to the widest portion of the third trench 1303. As shown in FIG. 12 and FIG. 15, the third trench 1303 is partially overlapping with the second trench 1302 to an extent that the joint C connecting the second contour surface 110L2 and the third contour surface 110L3 can be identified after the second blade saw operation.

Embodiments of the present disclosure are discussed in detail above. It should be appreciated, however, that the present disclosure provides many applicable concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor chip structure, comprising:
   a substrate having a top surface, a bottom surface, and a lateral surface connecting the top surface and the bottom surface, wherein the lateral surface comprises:
   a first portion having a first surface roughness and being in proximity to the top surface; and a second portion having a second surface roughness and being in proximity to the bottom surface,
wherein the first surface roughness is greater than the second surface roughness.

2. The semiconductor chip structure of claim 1, wherein a lowest point of the first portion is more distal to the top surface than a highest point of the second portion.

3. The semiconductor chip structure of claim 1, wherein the first portion comprises a parabola.

4. The semiconductor chip structure of claim 1, further comprising a metal trace at the first portion.

5. The semiconductor chip structure of claim 4, wherein the metal trace is in contact with the first portion.

6. The semiconductor chip structure of claim 1, wherein a vertical dimension of the first portion is in a range of from about 8 µm to about 17 µm.

7. The semiconductor chip structure of claim 1, wherein the lateral surface comprises dielectric material having a relative permittivity greater than 3.

8. The semiconductor chip structure of claim 1, wherein the first portion is directly connected to the second portion.

9. The semiconductor chip structure of claim 1, wherein the lateral surface further comprises a third portion farther away from the top surface than the second portion.

10. A semiconductor package, comprising:
    a substrate having a top surface and a bottom surface;
    an active region in proximity to the top surface; and
    an inactive region surrounding the active region, wherein the inactive region comprises:
        a first lateral surface;
        a second lateral surface; and
        a peak connecting the first lateral surface and the second lateral surface.

11. The semiconductor package of claim 10, further comprising a metal trace at the first lateral surface.

12. The semiconductor package of claim 11, wherein the metal trace is in contact with the first lateral surface.

13. The semiconductor package of claim 10, further comprising:
    a redistribution layer in the active region and in proximity to the top surface.

14. The semiconductor package of claim 13, further comprising a protection layer covering the redistribution layer.

15. The semiconductor package of claim 10, further comprising a seal ring structure between the active region and the inactive region.

16. The semiconductor package of claim 10, wherein the first lateral surface includes a parabola-shaped portion.

17. The semiconductor package of claim 10, wherein the first lateral surface and the second lateral surface comprise dielectric material having a relative permittivity greater than 3.

18. The semiconductor package of claim 10, wherein the first lateral surface has a first surface roughness and the second lateral surface has a second surface roughness, and the first surface roughness is greater than the second surface roughness.

19. The semiconductor package of claim 10, further comprising a third lateral surface connected to the second lateral surface, the third lateral surface farther away from the top surface than the first lateral surface.

20. The semiconductor package of claim 19, wherein the second lateral surface is between the first lateral surface and the third lateral surface.

* * * * *